(12) United States Patent
Myer

(10) Patent No.: US 8,029,154 B2
(45) Date of Patent: Oct. 4, 2011

(54) SOLAR-POWERED LIGHT POLE AND LED LIGHT FIXTURE

(75) Inventor: Seth Jamison Myer, Meridian, ID (US)

(73) Assignee: Inovus Solar, Inc., Boise, ID (US)

(*) Notice: Subject to any disclaimer, the term of this patent is extended or adjusted under 35 U.S.C. 154(b) by 0 days.

(21) Appl. No.: 12/755,082

(22) Filed: Apr. 6, 2010

(65) Prior Publication Data

US 2011/0085322 A1    Apr. 14, 2011

Related U.S. Application Data

(63) Continuation of application No. 12/025,737, filed on Feb. 4, 2008, now Pat. No. 7,731,383.

(51) Int. Cl.
*F21S 8/08* (2006.01)
*F21V 19/04* (2006.01)
*F21V 29/00* (2006.01)

(52) U.S. Cl. .......... 362/145; 362/20; 362/192; 362/431; 362/414

(58) Field of Classification Search .......... 362/20, 362/145, 183, 192, 249.01, 373, 294, 431, 362/414
See application file for complete search history.

(56) References Cited

U.S. PATENT DOCUMENTS

| | | |
|---|---|---|
| 4,043,834 A | 8/1977 | Rusch |
| 4,062,371 A | 12/1977 | Bolen |
| 4,200,904 A * | 4/1980 | Doan .......................... 362/183 |
| 4,224,082 A | 9/1980 | Jacobson |
| 4,281,369 A | 7/1981 | Batte |
| 4,384,317 A | 5/1983 | Stackpole |
| 4,404,472 A | 9/1983 | Steigerwald |
| 4,486,820 A | 12/1984 | Baba et al. |
| 4,718,185 A | 1/1988 | Conlin |
| 4,827,645 A | 5/1989 | Stamps, Jr. |
| 4,841,416 A * | 6/1989 | Doss .......................... 362/183 |
| D309,789 S | 8/1990 | Luce |
| 5,121,307 A | 6/1992 | Moore |
| 5,149,188 A | 9/1992 | Robbins |
| 5,217,296 A | 6/1993 | Tanner et al. |
| 5,660,643 A | 8/1997 | Toggweiler |

(Continued)

FOREIGN PATENT DOCUMENTS

WO    WO2004023849 A1    3/2004

(Continued)

OTHER PUBLICATIONS

Schmid, Small Power Photovoltaic Systems, Photovoltaic Solar Energy Conference, Oct. 27-31, 1986, pp. 113-220.

(Continued)

*Primary Examiner* — Ismael Negron
(74) *Attorney, Agent, or Firm* — Pedersen and Company, PLLC; Ken J. Pedersen; Barbara S. Pedersen

(57) ABSTRACT

A solar-powered street lighting system includes a flexible panel of amorphous photovoltaic adhesively connected to the outside surface of a light pole, at least one battery to be charged by the flexible panel, and an LED light fixture extending from the upper region of the pole. A controller controls the charging of the battery by the flexible panel, the battery powering the LED light fixture, and a minimum battery voltage by dimming the LED light fixture during at least a portion of nighttime to prevent excess battery drain.

37 Claims, 9 Drawing Sheets

U.S. PATENT DOCUMENTS

| | | | |
|---|---|---|---|
| 6,060,658 A * | 5/2000 | Yoshida et al. | 136/243 |
| 6,784,357 B1 | 8/2004 | Wang | |
| 6,930,237 B2 | 8/2005 | Mattiuzzo | |
| 6,988,809 B2 | 1/2006 | Rabinowitz | |
| 6,990,394 B2 | 1/2006 | Pasternak | |
| D517,233 S | 3/2006 | Doppelt | |
| 7,052,924 B2 | 5/2006 | Daniels et al. | |
| D529,655 S | 10/2006 | Allsop et al. | |
| 7,202,613 B2 | 4/2007 | Morgan et al. | |
| 7,301,457 B2 | 11/2007 | Houston | |
| 7,731,383 B2 | 6/2010 | Myer et al. | |
| 2005/0001564 A1 | 1/2005 | Pan | |
| 2006/0002110 A1 | 1/2006 | Dowling et al. | |
| 2007/0032990 A1 | 2/2007 | Williams et al. | |
| 2007/0085702 A1 | 4/2007 | Walters et al. | |
| 2007/0117017 A1 | 5/2007 | Sugiyama et al. | |
| 2007/0145915 A1 | 6/2007 | Roberge et al. | |
| 2007/0159836 A1 | 7/2007 | Huang et al. | |
| 2007/0253208 A1 * | 11/2007 | Howard et al. | 362/431 |
| 2008/0080174 A1 | 4/2008 | Xu | |
| 2008/0247155 A1 | 10/2008 | Allsop et al. | |

FOREIGN PATENT DOCUMENTS

| | | |
|---|---|---|
| WO | WO2010014925 | 2/2010 |
| WO | WO2010050993 A1 | 5/2010 |
| WO | WO2010057138 A2 | 5/2010 |

OTHER PUBLICATIONS

PCT International Search Report and the Written Opinion, PCT/US08/82301, Dec. 24, 2008. Applicant: Meyer.

Lighting Technology and Trends, and Transcription of text along with slide 16 and 17, Source Cooper Lighting Center, 2006, 19 pages.

PCT Search Report and the Written Opinion, PCT/US2009/064659, Jul. 5, 2010, Applicant: Inovus Solar, Inc. et al.

PCT Search Report and the Written Opinion, PCT/US2009/052443, Mar. 26, 2010, Applicant: Ming Solar, INC. et al.

* cited by examiner

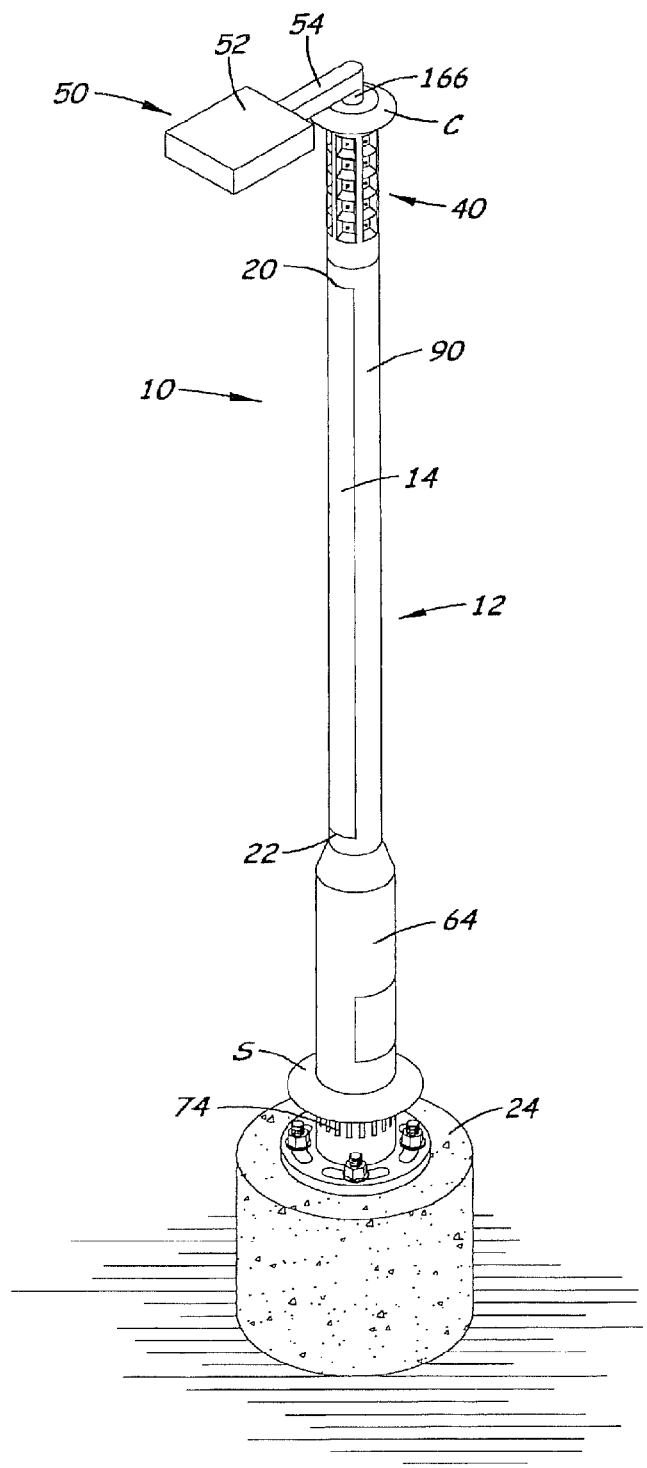
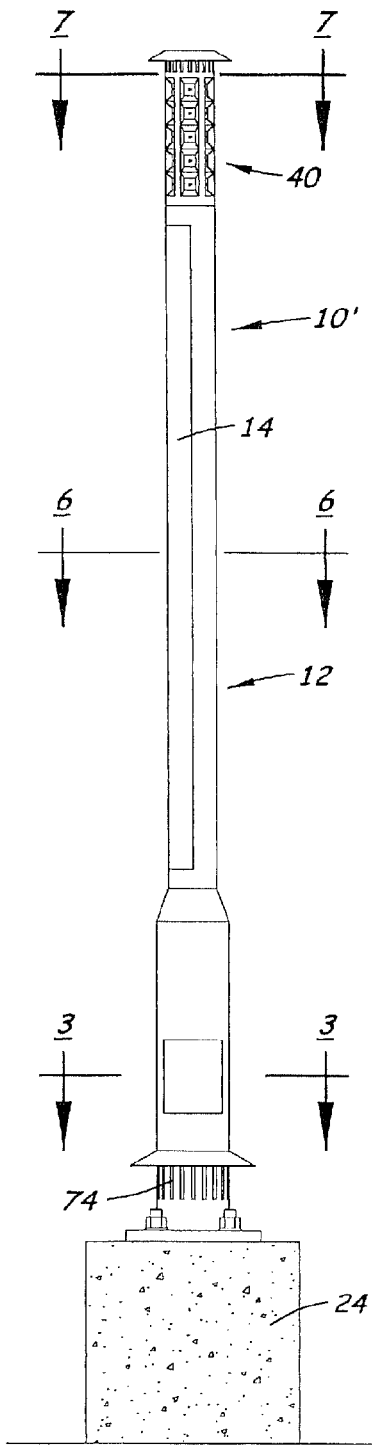
Fig. 1
Fig. 2

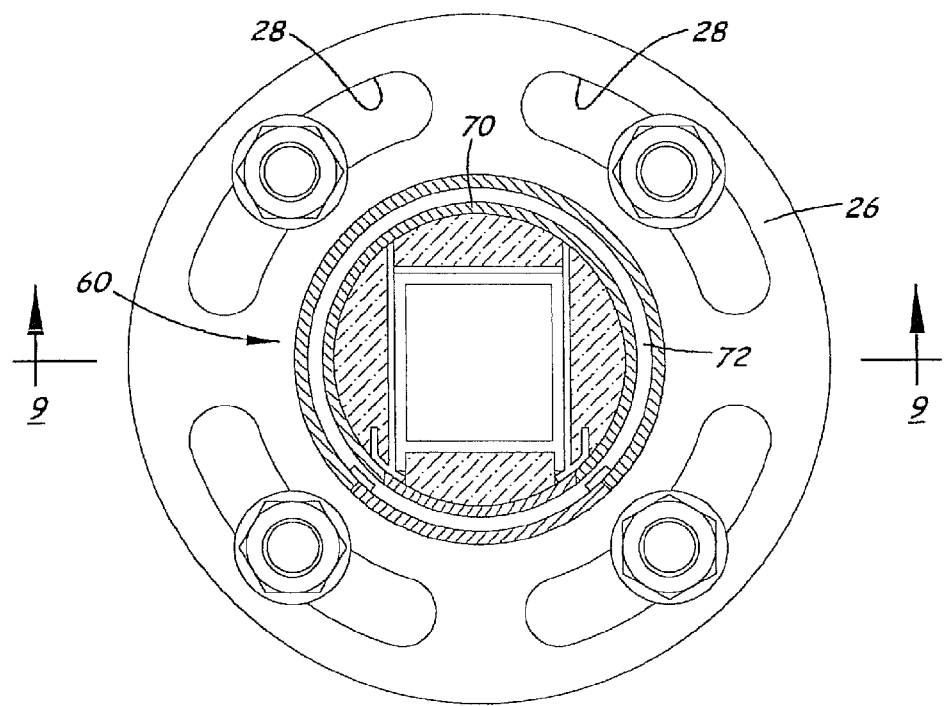
Fig. 3
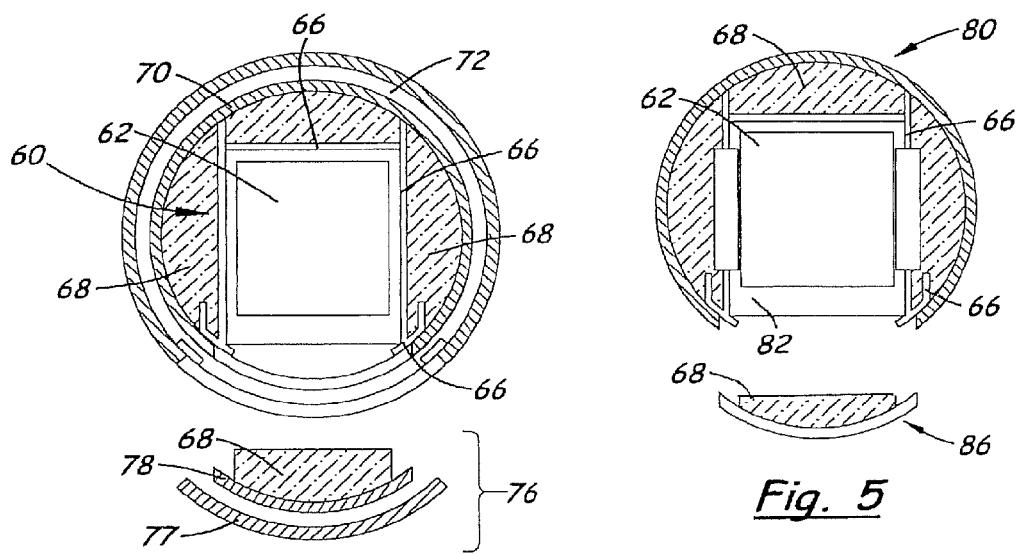
Fig. 4
Fig. 5

SOLAR-POWERED LIGHT POLE AND LED LIGHT FIXTURE

This application is a continuation of U.S. Non-Provisional application Ser. No. 12/025,737, filed Feb. 4, 2008, which claims priority of Provisional Application 60/888,002, filed Feb. 2, 2007, the entire disclosures of which are incorporated herein by this reference.

BACKGROUND OF THE INVENTION

1. Field of the Invention

This invention relates to solar-powered outdoor lighting. More specifically, the invention relates to pole-mounted lighting that is powered by solar energy by means of a photovoltaic panel on the outside surface of the pole and batteries or other storage devices. The invented outdoor lighting has a structure, shape, and profile that look much like conventional street lights, for matching pre-existing street lights and/or accommodating local or govermnental aesthetic preferences.

2. Related Art

Solar-powered street lights and light fixtures have been developed in the past. For example, the patent literature includes: Robbins (U.S. Pat. No. 5,149,188, issued Sep. 22, 1992); Yoshida (U.S. Pat. No. 6,060,658, issued May 9, 2000); Wang (U.S. Pat. No. 6,784,357, issued Aug. 31, 2004); and Doppelt (U.S. Patent D517,233, issued Mar. 14, 2006). Also, solar-powered street lights have been available commercially and/or tested publicly that include flat panel(s) of solar cells in a rack or frame, said flat panels typically being supported above the light pole. Such flat panels of solar cells are typically visually distracting and/or aesthetically unappealing, as they are a large protuberance from the street light and/or have the appearance of a large platform supported atop the street light. Yoshida discloses a street light with multiple flat panels of solar cells provided vertically on more than one side of a street light pole. Yoshida and the other prior art known to the inventor, however, do not address or solve many of the issues that the present inventor has found to be important in providing an efficient, economical, temperature-versatile, long-life, and aesthetically-pleasing solar-powered outdoor light system.

Therefore, there is still a need for an outdoor lighting system that is highly efficient in collecting and storing energy from the suns rays, and in using said energy over several nights to light a surrounding area even through inclement, overcast periods of time. The present invention meets these needs. Preferred embodiments utilize a cooling system that may greatly increase battery life and efficiency of the entire system. Preferred embodiments also utilize an efficient, versatile LED light fixture that may be used for all or nearly all street light styles without the need to separately engineer LED fixtures for each lamp/fixture style desired by the public, government, or neighborhood. Preferred embodiments have a visually-integrated appearance, preferably without flat panels of solar cells, and preferably with minimal or no unaesthetic protuberances and exposed equipment.

SUMMARY OF THE INVENTION

The present invention comprises solar-powered outdoor lighting that utilizes a photovoltaic panel(s), preferably amorphous photovoltaic laminate (PVL), and light-emitting diodes (LEDs) to produce light, over a several-night period even during inclement, cloudy, or overcast weather conditions. In one embodiment, the invention comprises a light pole having a vertical portion covered by a flexible photovoltaic panel for being contacted by sunlight, and an LED light fixture powered by said photovoltaic panel via a battery or other energy storage device. The preferred flexible panel is a sheet of amorphous thin-film photovoltaic material(s) surrounding a significant portion of the circumference of the pole at least in one region along the length of the pole, and, preferably along the majority of the length of the pole. The light pole is specially-adapted for cooling of the photovoltaic panel, the batteries contained within the pole, if any, and the preferred LED light fixture. Said cooling is important for achieving the high efficiencies of power production and storage, over long equipment lives, as exhibiting by the preferred embodiments The preferred light pole according to the invention is similar in exterior appearance to conventional light poles, in that the pole profile is generally smooth and of generally the same or similar diameter all the way along the length of the pole. The photovoltaic panel fits snugly against the pole outer surface and requires no brackets, racks or other protruding structure. The preferred LED fixture is at or near the top of the pole, is generally a vertical cylinder of the same or similar diameter as the pole, and may be convectively cooled by air flow up through the pole. The preferred LED fixture eliminates the need for the difficult engineering task of adapting the many common styles of outdoor light fixtures to use LEDs. Further, because the preferred battery system is concealed either inside the pole, inside a base holding the pole, or buried below the grade level of the ground or street, there is no need for a large box or protruding battery structure on or near the pole.

In the event that the purchaser or public wish the lighting system to match or be reminiscent of previously-installed or other conventional street lights, a conventional-looking lighting fixture may be provided in addition to the preferred LED fixture. Said conventional-looking lighting fixture may extend horizontally or from atop the pole, and may be purely decorative, or may have a minimal or token light-emitting device therein. Such a decorative light fixture may more easily meet with approval from the public and/or may blend in with traditional street lights that remain in an area. By using a combination of the LED fixture and a decorative fixture, the single LED light-producing section may be engineered and installed, while preserving various aesthetic options for the city, county, or neighborhood and/or while allowing the new solar-powered lights to "blend in" with the street lights already in place. Further, the decorative light fixtures may be light-weight and designed to break-away in high winds or storms, thus minimizing the damage to the pole, surrounding property, and/or people.

The preferred LED light fixture comprises arrays of LED's that emit light from at least three and preferably four generally vertical sides of the fixture. The LED light fixture may emit light out in patterns extending 180 degrees-360 degrees around the fixture, for example. The LED fixture comprises heat exchange or other cooling means in order to lower the temperature of the LEDs and the associated equipment.

In another embodiment, an outdoor light pole, having the features described above, is provided on, and hinged to, a portable base. In such an embodiment, the battery system may be located in, and provide additional weight for, the base.

In some embodiments, the solar-powered outdoor lighting system is connected to the utility grid, so that the photovoltaic panel may provide energy to the grid during peak-demand daylight hours, and so that, if needed or desired, low cost night-time electricity may be provided by the grid to the outdoor lighting system. Preferably, even in such embodiments tied to the grid, batteries or other storage devices are provided that may also be charged during the daylight hours, for providing power to the lighting system during the night hours, and/or providing power to the lighting system in the event of a grid failure or natural catastrophe that interrupts grid power supply.

In the preferred embodiments, venting and/or air channels are provided in the pole to allow cooling by natural convection air flow through the pole and the light fixture. Optionally, heating equipment may be provided in one or areas of the pole to protect equipment and/or enhance operation during extreme cold.

In other embodiments, the invention comprises the LED fixture without the street light pole, wherein the fixture may be connected to various other poles or stands, supports, fences and buildings. The LED fixture may be effective and aesthetically pleasing for various patio, driveway, entryway, commercial buildings, and/or other outdoor supports and structures, for efficient and long-lived light production.

In other embodiments, the invention comprises the solar-powered pole only, wherein power supplied by the photovoltaic panel on the pole may be provided to various types of apparatus, including LED lights, incandescent lights, and equipment other than lights.

BRIEF DESCRIPTION OF THE DRAWINGS

FIG. 1 is a front perspective view of one embodiment of a light pole system according to the invention, the light pole being anchored to a concrete base.

FIG. 2 is a side view of the embodiment in FIG. 1, with the decorative light fixture removed.

FIG. 3 is top, cross-sectional view of the light pole of FIGS. 1 and 2, viewed along the line 3-3 in FIG. 2, and illustrating to best advantage one embodiment of an adjustable connection between the light pole and the concrete base, and one embodiment of a battery system provided in the lower section of the pole.

FIG. 4 is a top, cross-sectional view of the battery compartment of FIG. 4, shown with pole and sleeve access doors removed for access to the batteries.

FIG. 5 is a top, cross-sectional view of an alternative battery compartment, without a sleeve and with a single access door through a side of the pole.

DESCRIPTION OF THE PREFERRED EMBODIMENTS

Figure 6:
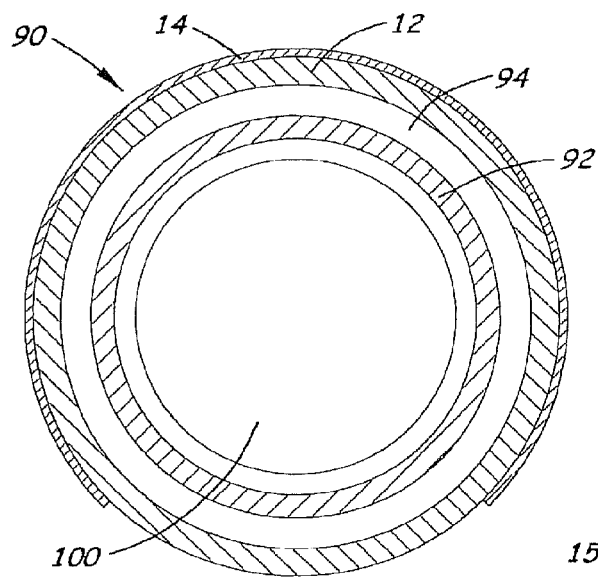
FIG. 6 is a top, cross-sectional view of a middle section of the pole of Figures land 2, illustrating the preferred flexible amorphous photovoltaic panel applied to the outside of the pole, and a sleeve system for cooling the photovoltaic panel and allowing air flow to continue up to the LED light fixture.

Referring to the Figures, there are shown several, but not the only, embodiments of the invented lighting system. FIG. 1 portrays one embodiment of a solar-powered street light 10, comprising a pole 12 with a panel 14 of thin-film photovoltaic material attached thereto. The panel 14 is preferably selected from commercially-available amorphous silicon (non-crystalline) photovoltaic materials that produce electrical energy when exposed to sunlight. One source of material for the panel 14 is Uni-Solar (United Solar Ovonic), which flexible, non-framed laminates that may be used in embodiments of the invention, under the name of UNI-SOLAR® "solar laminates" or "photovoltaic laminates."

While currently-available flexible photovoltaic laminates, such as the UNI-SOLAR solar laminates are preferred, it is envisioned that thin-film light-active materials being developed, or to be developed in the future, may be used in embodiments of the invention, wherein said materials being developed or to be developed may be used in the place of the panel 14 described herein. For example, it is envisioned that photovoltaic material may be applied directly to the pole 12 in the form of a liquid having components that later polymerize or "set up" on the pole and retain the photovoltaic material on said pole. Thus, the flexible photovoltaic panels described herein may be provided as a flexible sheet attached to the pole, or as other thin-film materials applied to the pole and taking the form of the pole, that is, preferably curving at least 225 degrees around the pole.

The panel 14 is a thin, flexible sheet that is preferably adhered to the pole by adhesive. The panel 14 may be a single, continuous sheet with "self-stick" adhesive on a rear surface, and that, upon peeling off of a protective backing, may be directly applied to the pole. The integral adhesive makes attachment of the panel 14 simple and inexpensive. No bracket, rack, covering, casing, or guard is needed over or around the panel, and this simplicity of attachment preserves the aesthetics of the preferred slim and smooth profile of the pole. Less-preferably, multiple, separate panels may be adhesively applied to the post 12 and operatively connected.

The panel 14 extends continuously around the pole along a significant amount of the circumference (preferably at least 225 degrees and more preferably about 270 degrees) of the pole in order to be directly exposed to sunlight all through the daylight hours. As illustrated in FIGS. 13-16, this coverage of the pole will expose the panel 14 to the suns rays generally from sunrise to sunset, in order to maximize solar-power generation. The panel 14 preferably covers ½-¾ of the length of the pole, extending from its upper edge 20 at a location near the top of the pole to its lower edge 22 several feet above the base 24 supporting the pole. It is preferred that the lower edge 22 be high enough from the ground or street level that passers-by or vandals cannot easily reach the panel 14 to cut, pry off, or otherwise damage the panel.

Connection of the pole 12 to the base 24 may be done in various ways, each typically being adjustable so that, at the time of installation, the pole may be turned to orient the panel 14 optimally to catch sunlight through the day. The adjustable connection, shown in FIGS. 1 and 3 to best advantage, includes a pole base flange 26 having multiple, curved slots 28 through which bolts extend, so that the bolts may be tightened to secure the pole to the base 24 after the pole is rotated to the desired orientation. The connection of the decorative light fixture (50, discussed below), may also be adjustable, so that, given any orientation of the pole, the decorative light fixture may be secured/tightened to point in the desired direction, for example, over a street or sidewalk.

The main, or only, light-producing unit of the preferred street light 10 is a light-emitting diode (LED) fixture at or near the top of the pole 12. The preferred LED fixture 40 has a cylindrical outer surface and is coaxial with, and of generally the same diameter as, the upper end of the pole 12. This LED fixture, as will be discussed further below, may emit light out in a 360 degree pattern, or, may be adapted by LED and/or reflector placement and shape to emit various patterns of light as needed for a particular setting.

Figures 11, 12:
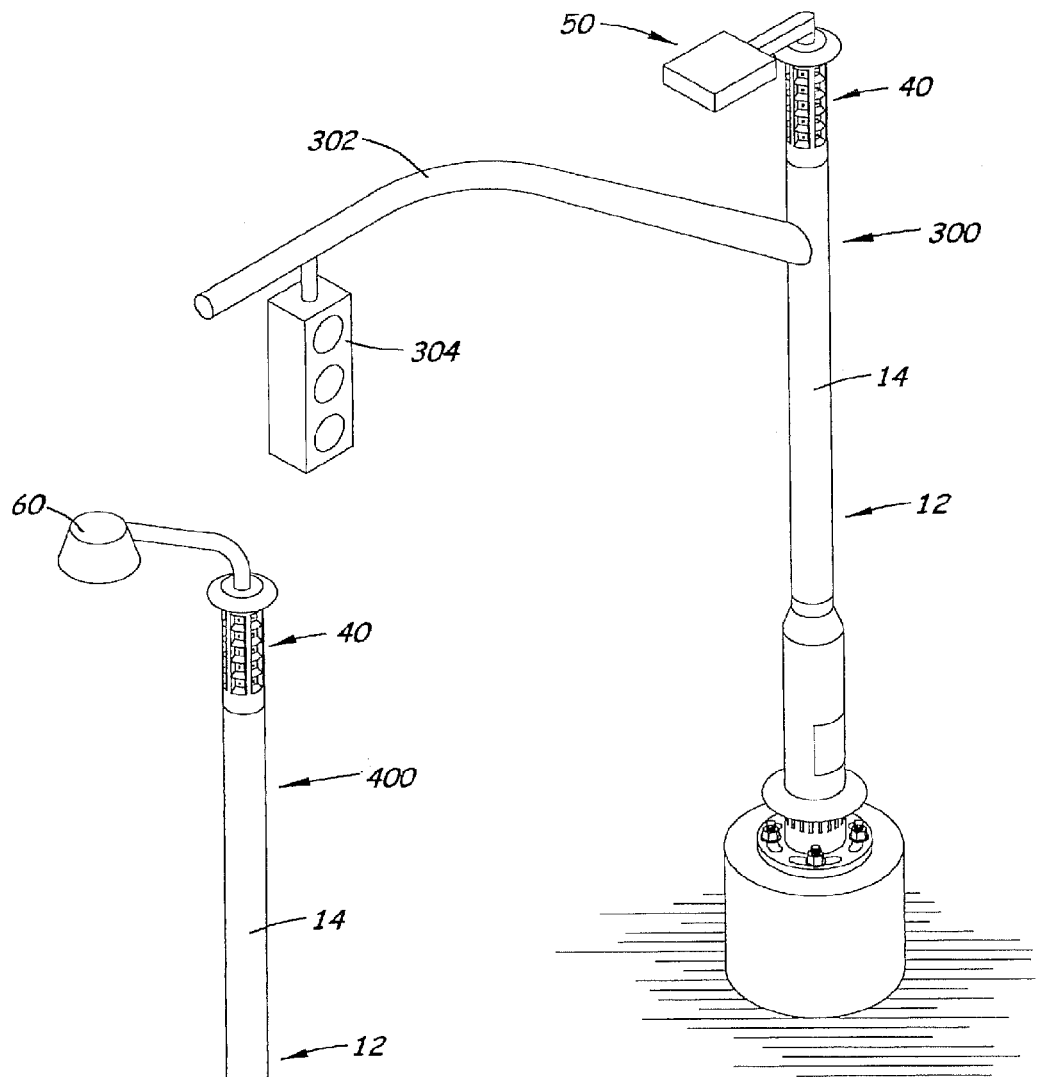
FIG. 11 is a side, perspective view of another embodiment comprising a decorative light fixture at the top of the pole plus an arm and traffic light extending from the pole.
FIG. 12 is a side, perspective view of another embodiment of the invented light pole system for use by a highway, wherein the battery system is buried in the ground instead of being contained inside the pole or inside the base, and wherein the pole may be a break-away pole, both features being for improved safety in the event of a vehicle hitting the pole.
Figure 13:
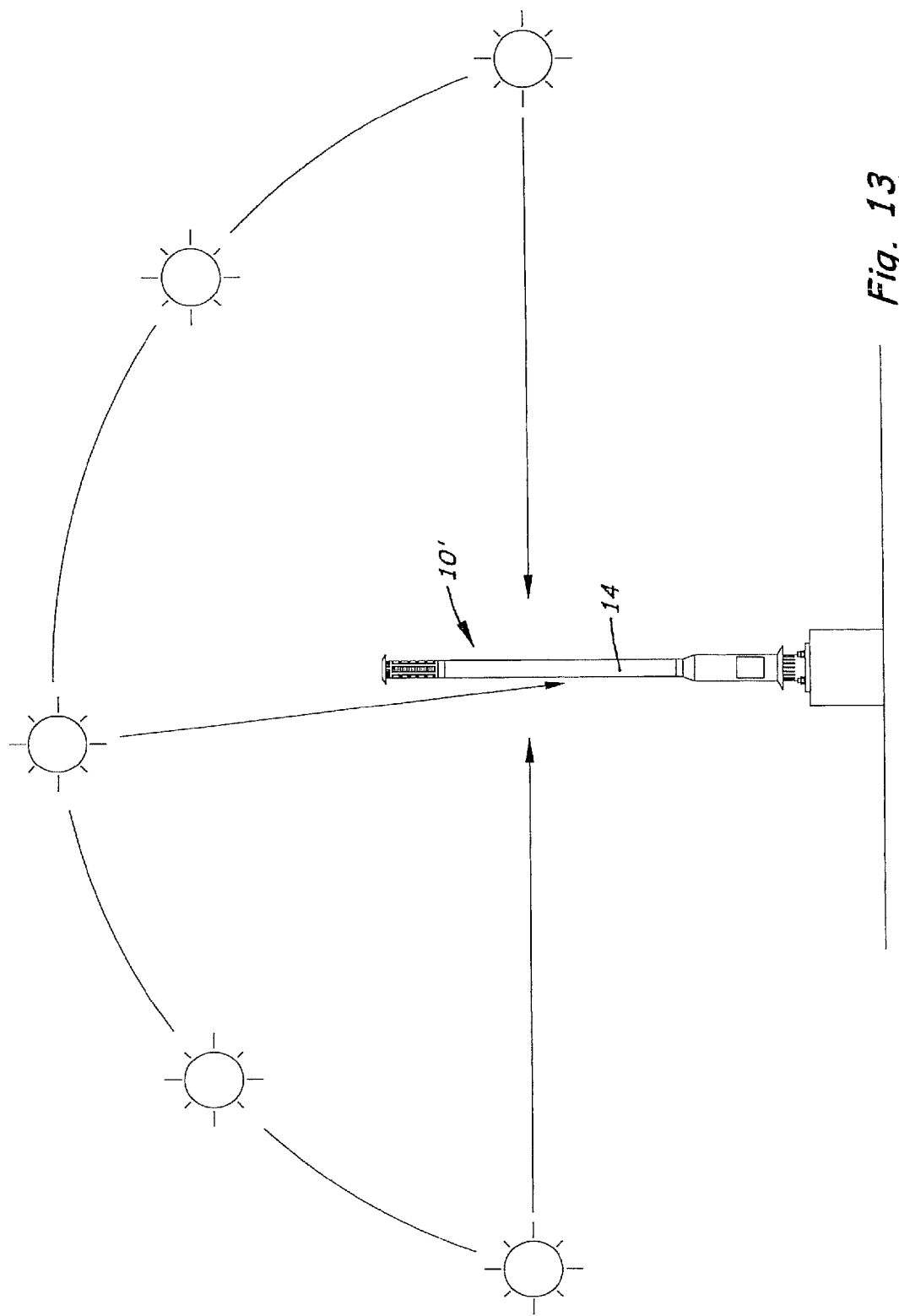
FIG. 13 is a schematic illustration of sunlight hitting the preferred vertical photovoltaic panel adhered to the light pole, wherein morning and evening light hit the sheet at close to perpendicular to the sheet surface and the noon sunlight hits the sheet surface at an acute angle.
Figure 14:
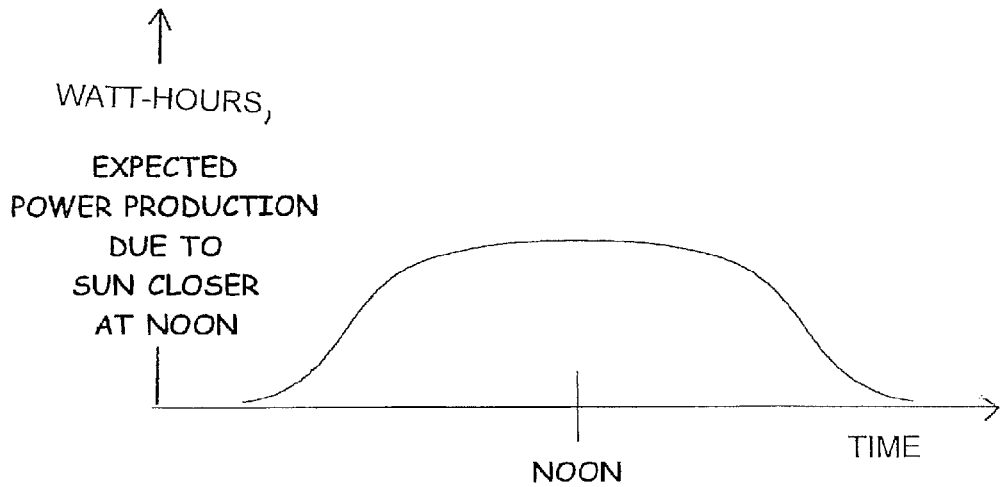
FIG. 14 illustrates the common conception of power production (for example, watt-hours) vs. time that is expected to be produced from a light-active device over a day.
Figure 15:
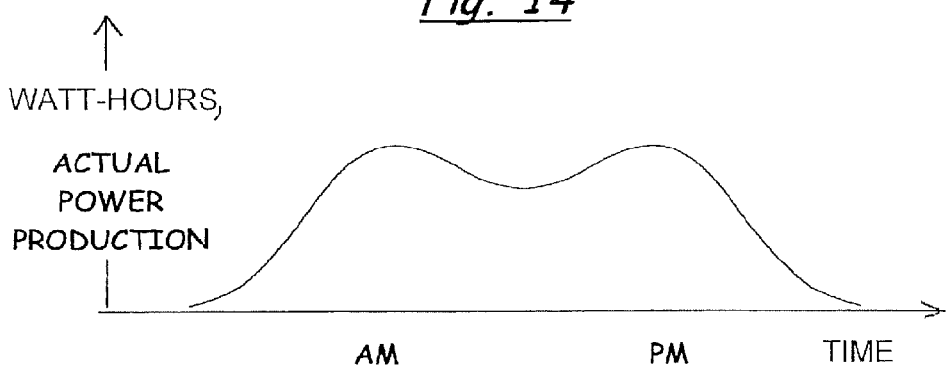
FIG. 15 illustrates the actual power produced (for example, watt-hours) vs. time, by embodiments of the invention, wherein power production from the morning and evening sun is higher than expected. The curve illustrates a power production increase from early morning until mid or late morning, and then a dip in production due top the sharp incident angle of sunlight around noon when the sun rays hit the pole at sharp angles to the photovoltaic panel.
Figure 16:
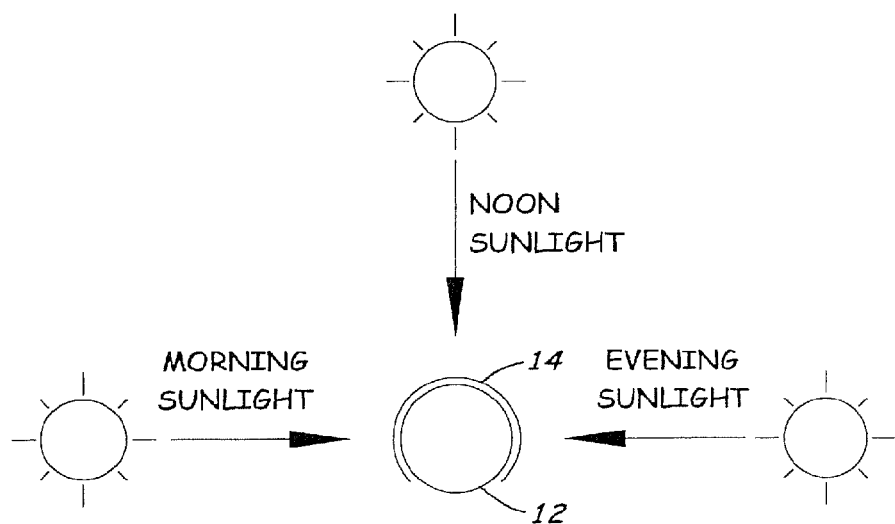
FIG. 16 schematically illustrates that the preferred photovoltaic panel is provided around most of the circumference of the pole, so that said panel is available and catches the suns rays during the entire day.

The decorative light fixture 50 is portrayed in FIG. 1 as a box-style fixture on a horizontal arm, but may be other fixtures The decorative light fixture 50 comprises a housing 52 and connecting arm 54 that are the same or similar to conventional fixtures. The decorative light fixture 50, however, has no internal or external workings to produce light, no bulb and no wiring, as the fixture 50 is merely a "token" or "fake" light fixture simulating the appearance that the public is used to. The decorative light 50 may have a conventional lens that contributes to the fixture looking normal during the day. Alternative decorative light fixtures may be provided, for example, a "gas lamp" glass globe that extends up coaxially from the LED fixture 40, or a curved-arm with conical housing 60 as shown in FIG. 12.

The inclusion of a decorative fixture may make the overall appearance of the street light 10 more desirable for the public or the governmental/transportation agency installing and maintaining the street light 10. This may make the overall appearance of the street light 10 match or complement pre-existing fixtures or the style or desires of a neighborhood. Having a decorative light fixture 50 may be reassuring and comforting to the public, as they will automatically recognize the street light 10 as a light for public safety, rather than worrying that the structure is an antenna or transmitter, surveillance structure, or some other undesirable structure in the their neighborhood, for example.

Alternatively, the decorative light fixture 50 may be adapted to provide some light output, for example, a single LED or other minimal light source to further enhance the aesthetics of the street light 10. Such a minimal light source will light the interior of the housing and/or the fixture lens, to prevent the decorative fixture from appearing to be burnt-out, and to suggest to passers-by that the fixture 50 is indeed providing light as is customary and comfortable for the public. While said decorative light fixture 50 may comprise said minimal light source, it is preferred that the LED light fixture provide at least 80 percent, and preferably at least 90 percent, of the light from the system 10, 10'.

FIG. 2 illustrates the light pole in use with the decorative, non-lighting or minimally-lighting fixture 50 removed, in which form the street light 10' is fully functional for providing the desired amount of light for the street or neighborhood by means of the LED fixture 40. This version of street light 10' has, therefore, no significant protrusions from its elongated, vertical structure, and has a slim, sleek appearance that, over time, may become preferred for many settings.

FIG. 3 illustrates the adjustable connection of the pole 12 to the base 24, and shows the internals, in cross-section, of the storage system 60 with batteries 62 stored in the lower section 64 of the pole and operatively connected to the panel 14. The batteries 62 store the energy provided by the solar panel during the day or previous days, and power the LED fixture 40 during the night. The battery system is adapted to store enough energy to power, when fully charged, the LED fixture 40 for several nights with little or no additional charging and without any outside energy input. The battery system preferably stores enough energy to power the LED fixture for at least 5 nights and, more preferably, 5-9 nights equating to about 50-100 hours or more depending upon the number of hours in a night. Thus, the street light 10, 10' is capable of autonomously illuminating (that is, with only the energy provided by the stored energy from solar collection) the surroundings for several, and preferably at least 5 nights, even when the light 10, 10' is located in an overcast, inclement, hazy or smoggy location, all of which conditions will diminish the intensity of the daytime sun hitting the panel 14. In other words, the large amount of energy stored in the batteries during days of clearer weather is sufficient to "carry the light through" cloudy and inclement weather for about a week, until improved sunlight conditions return. The amorphous thin-film panel 14 is more shade-tolerant than conventional crystalline solar cells, and is therefore expected to be more efficient and effective than banks or racks of crystalline solar cells.

Figure 18:
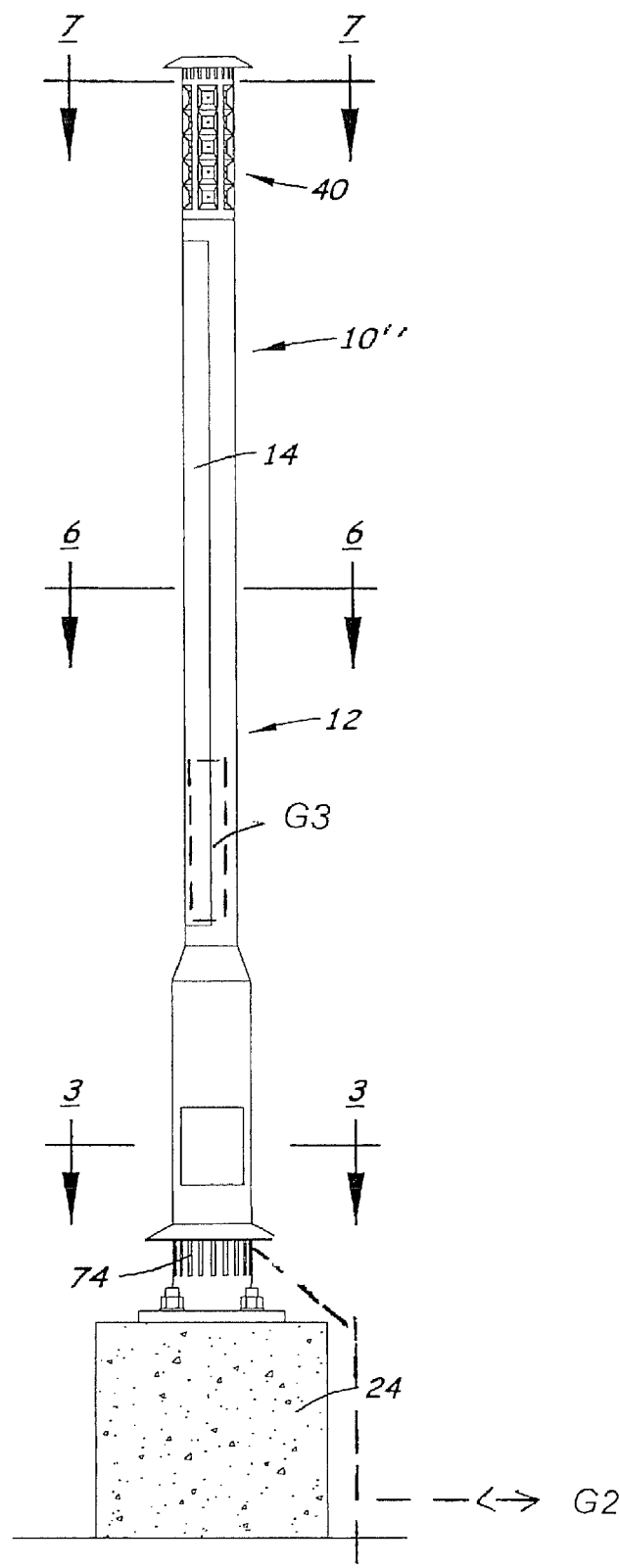
FIG. 18 is a perspective view of an alternative solar-powered light system including a connection (shown schematically) to a utility grid.

In alternative embodiments, the light 10" (see FIG. 18) may be tied to the utility grid, for example, for providing power to the grid during the day and preferably also charging batteries during the day, and then receiving less expensive power from the grid during the night and/or also receiving power from the batteries as a supplemental/backup power source. In FIG. 18, connection to the grid is shown schematically as G1 (underground) or G2 (above-ground) and one of skill in the art will understand how to build, install, and manage said connections. Such a grid-tied embodiment that also has battery storage capability may provide the benefit of supplementing the grid during peak electricity-usage hours, while also being capable of being autonomous (independent of the grid) in the event of disaster or other grid outage. In such embodiments, an inverter and control and measurement systems (G3 in FIG. 18) will be added, for example, inside the pole, to cooperate with the utility grid and measure and record the system's energy contribution to the grid.

Controllers are provided to manage charging of the batteries and delivery of energy to the lighting system and/or other components. Control of the operative connection between the batteries 62 and panel 14 and the operative connection between the batteries and the LED fixture 40 and other components may be done by electronics, circuitry, and/or semiconductors, for example, control board 80 shown in FIG. 7. The controller(s) preferably continually monitor(s) battery voltage and temperature to determine battery health, to improve both battery performance and life. Said controller(s) preferably control the speed and the amount that the batteries are charged and discharged, which can significantly affect battery life. Combined with the preferred cooling system for managing battery temperature, the batteries of the preferred embodiments are expected to exhibit longer lives, and better performance, than prior art batteries installed in solar-powered light systems.

A first controller delivers a low-current (trickle) charge from the solar collector panel 14 to the batteries. This controller also preferably limits the maximum voltage to a voltage that will not damage or degrade the battery/batteries. A second controller draws current from the battery/batteries and delivers it to the LED fixture and other electric device(s) requiring power from the batteries. The minimum battery voltage is also protected by the controller to prevent excess battery drain. During prolonged periods of inclement weather and low daytime energy generation, the controller(s) may dim the lights during part or all of the night to reduce the amount of energy being consumed while still providing some lighting of the surroundings. The controller(s) may turn the light on based on a signal from a photocell and/or a motion sensor, and off with a timeclock, for example.

The controller system(s) may comprise computer logic, memory, timers, ambient light sensors, transmitters, receivers, and/or data recording and/or output means. Said controller systems may comprise only electronics and apparatus to operate the single light 10, 10' in which it resides, or may additionally comprise electronics and apparatus that communicate with a central control station and/or with other street lights. Said communication is preferably accomplished wirelessly, for example, by means of a "multiple-node" or "mesh" network via cell-phone radio or satellite communication. Such a network of multiple street lights ("multiple poles") and a central control station may allow monitoring, and/or control of the performance of individual lights and groups of lights, for example, the lights on a particular street or in a particular neighborhood or parking lot. Such performance monitoring and/or control may enhance public safety and improve maintenance and reduce the cost of said maintenance. A central control station may take the form of, or be supplemented by, a server accessible via an interne website, for example.

The entire system for storing and using energy preferably uses only direct current (DC). Benefits of this include that LED lights use DC energy; the DC system is low-voltage, easy to install and maintain, and does not require a licensed electrician; and energy is not lost in conversion from DC to AC.

The preferred batteries are sealed lead-acid AGM-type batteries or gel-cell batteries, nickel metal hydride batteries, or lithium batteries, for example. It is desirable to maintain the batteries 62 within a moderate temperature range, for example, 40-90 degrees F. as exposure of the batteries to temperatures outside that range will tend to degrade battery performance and life. Daily battery performance may be reduced by more than 50 percent by cold weather, and batteries may stop working entirely in very low temperatures. Further, high temperatures tend to also degrade battery performance and life.

Figure 17:
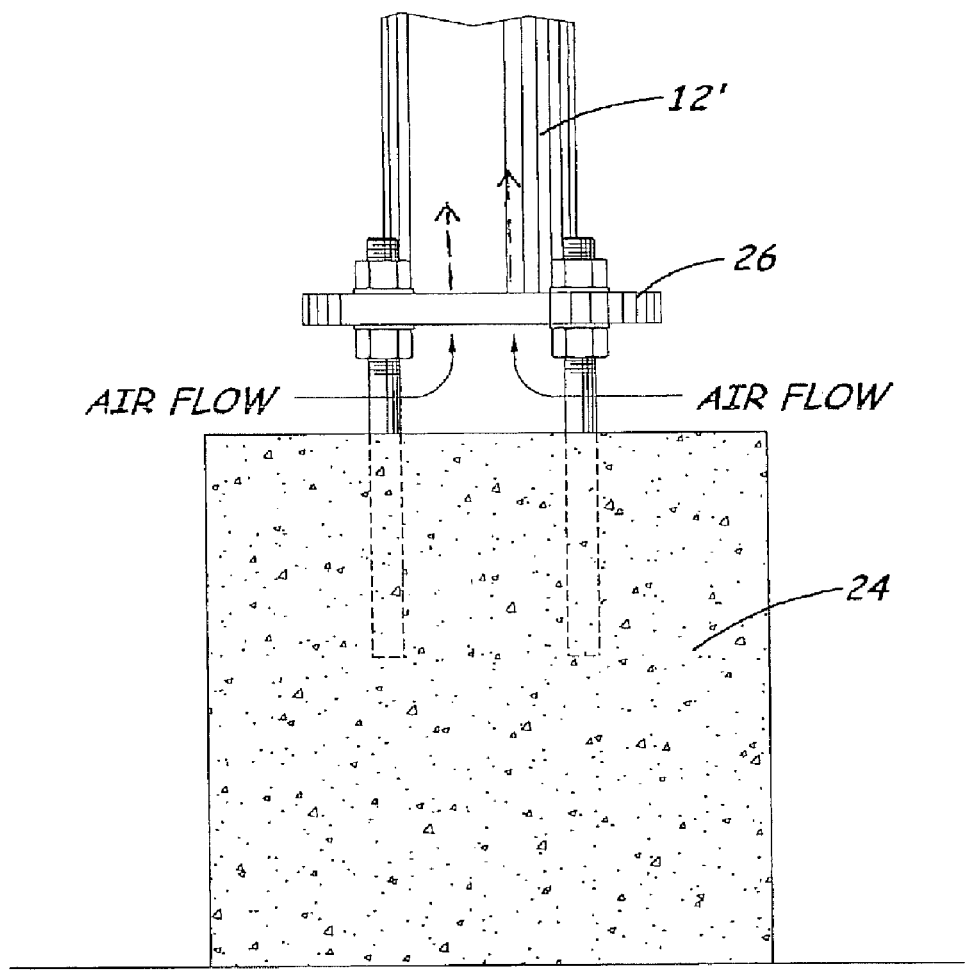
FIG. 17 is a partial detail view of an alternative, especially-preferred lower pole vent, wherein air is taken in between the pole flange and the base, through spaced between bolts that secure and raise the pole slightly above the base.

In the preferred configuration shown in FIG. 4, the batteries 62 are supported in a bracket(s) 66 and surrounded on multiple sides by insulation 68 for protecting the batteries from cold weather, preferably to help keep the batteries above about 40 degrees F. Further, said insulated batteries, and/or the bracket system supporting them, are connected to and contained inside a cooling sleeve 70 that is beneficial in hot weather, preferably to keep the batteries below about 90 degrees F. The cooling sleeve 70 is concentric with, and the same general shape as the wall of the pole12. The sleeve 70 is of smaller diameter compared to the pole, for example, 2-4 inches smaller diameter, forming an annular air flow space 72 inside the pole along the length of the lower section 64 of the pole. Air enters the intake vents, for example, slits 74 around the pole in FIGS. 1 and 2, and flows up through the annular space 72 past the bracket(s) 66 and batteries 62 to cool said batteries 62. Said vents 74, and the open top of the flow space 72 that preferably communicates with the LED light fixture 40, are examples of at least one lower pole vent and at least one upper pole vent adapted for ventilation of at least a portion of the pole by natural convection up through said at least one portion of the pole. Preferably, the flow space 72, or alternative internal spaces for draft up the pole, communicates with the LED light fixture, but alternative ventilation systems may be independent from the LED light fixture. Retelling to FIG. 17, there is shown another, alternative lower pole vent. The lower pole vent of FIG. 17 is provided (instead of vents 74) by providing spaces around the flange of the pole 12' by virtue of the flange being spaced from the base 24 by a bolt system that may be used to level the flange (make the pole vertical) on a base on uneven ground. The bottom end of the pole 12' has a bottom end opening (not shown) into which the air flows (instead of flowing into vents 74), and said bottom end opening is in fluid communication with the annular space 72 or other interior axial spaces inside the pole for creating the ventilation draft described elsewhere in this disclosure.

In FIG. 5, an alternative battery system 80 is shown, wherein no cooling sleeve is provided, but air may flow up through the battery section through axial spaces 82 around the batteries 62. Insulation 68 is preferably provided at and near the pole inner surface and extending most of the way to the batteries 62, however, with the exception of the axial spaces 82 that provide channels for air flow up through the system 80.

One may note that the designs shown in FIGS. 4 and 5 both have access doors systems 76, 86 that allow insertion, maintenance, and removal of the batteries 62 from the lower section 64. The access door system of FIG. 4 comprises both a door 77 in the pole and a door 78 in the sleeve 70. The sleeve door 78 of FIG. 4 may be insulated, so that the batteries are surrounded circumferentially by insulation, or, in alternative embodiments the sleeve door 78 may be un-insulated or even eliminated. The access door system 86 of FIG. 5 comprises only a door in the pole, and is insulated, so that the batteries are surrounded circumferentially by insulation. Other bracket, insulation, and door configurations may be effective, as will be understood by one of skill in the art after reading this disclosure.

FIG. 6 illustrates the internal structure of the middle section 90 of the pole 12, wherein the flexible panel 14 is wrapped and adhered to the pole outer surface. It should be noted that the preferred pole is a hollow, straight (or right) cylinder, and the preferred panel 14 is applied continuously around at least 225 degrees of the pole, so that sunlight "collection" is maximized. However, other pole shapes may be effective if the corners are rounded to allow the panel 14 to bend gently around said corners. For example, a square, rectangular, or polygonal pole, with rounded corners, may be effective, with the panel 14 still being provided in a single panel, and not needing to be held in brackets or frames on the various flat sides of the poles.

Inside the middle section 90 of the pole 12 is an axially-extending sleeve 92, which creates an annular space 94 that extends through the entire middle section 90. This annular space 94 fluidly communicates with the annular air flow space 72, or other air flow spaces 82 of the lower section 64, so that air vents from the lower section 64 through space 94 of the middle section 90 and to the LED fixture 40, as further described below. Ventilation by air flow up through the middle section 90 of the pole keeps the inner surface of the panel 14 cooler than the outer surface that is "collecting" the sun light. This may be important for efficient operation of the solar panel 14, to maintain a temperature gradient between the higher temperature outer surface and the cooler inner surface of the panel. Thus, it is not desirable to have insulation between the panel 14 and the pole 12. The pole middle section 90 may be made without a sleeve 92, in which the hollow interior of the pole might serve in place of space 94 as the air vent chimney in fluid communication with spaces 72 or 82 and the LED fixture.

The middle section 90 may house long-term energy storage 100 comprising capacitors, fuel cells and/or a hydrogen storage tank, for example. Capacitors would have the advantage that they would not be as affected by heat and cold as are batteries. Typically, capacitors would have longer lives than batteries, for example, up to about 20 years, compared to 2-5 years for batteries. Fuel cells could be used for applications that require longer autonomy than 5 days. The fuel cell and hydrogen storage tank could be integrated into the middle section 90 or lower section 64 of the pole, or into the base or an underground container. Venting similar to that required for the battery system would be required for off-gassing.

Figure 8:
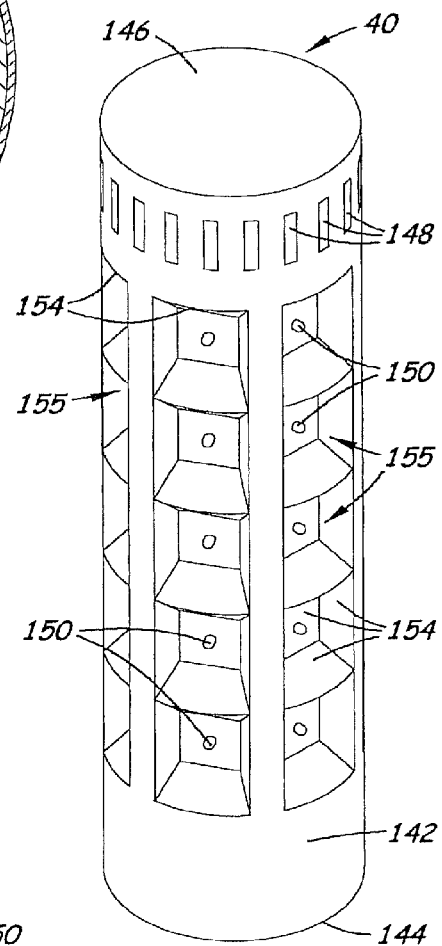
FIG. 8 is a side, perspective view of the LED Fixture of FIGS. 1, 2, and 7.
Figure 7:
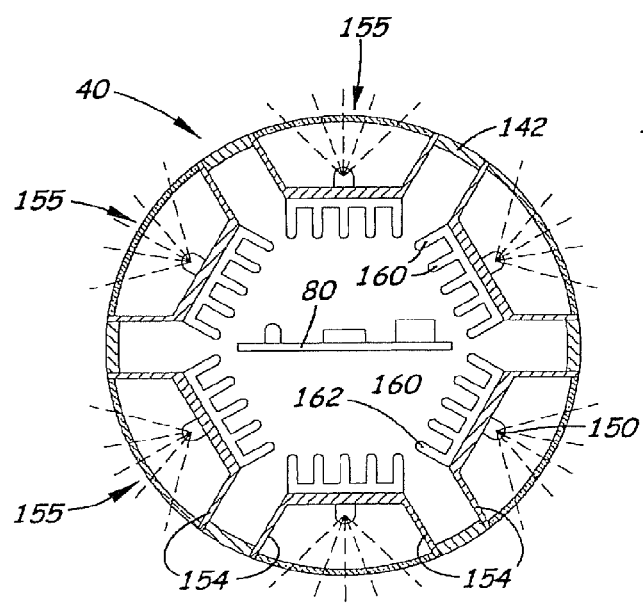
FIG. 7 is a top, cross-sectional view of the LED fixture of the embodiment of FIGS. 1 and 2.

FIGS. 7 and 8 portray transverse cross-section, and side perspective, views, respectively, of the preferred LED fixture 40 positioned above the middle section 90 of the pole. The fixture is preferably cylindrical and longer axially than it is in diameter. The fixture 40 is preferably the same diameter as the pole middle section, and comprises preferably a constant or nearly-constant-diameter housing 142. The housing 142 is substantially hollow with an open bottom end 144 in fluid communication with the middle section 90 and a closed upper end 146. Vents 148 are provided near the upper end 146 to allow air that flows up through the pole 12 to pass through the fixture 40 and then exit at or near the top of the fixture. Open bottom end 144 and vents 148 may be considered examples of a lower vent and an upper vent adapted for ventilation of said light fixture by natural convection up through the light fixture. Other venting systems comprising at least one lower vent and at least one upper vent may be used, including, but not necessary limited to, systems that utilize upwards draft from/through at least portions of the pole to create/enhance ventilation of the LED light fixture. There also may be ventilation systems for the LED light fixture that are independent from pole ventilation.

Compared to other light sources, LEDs are smaller, more efficient, longer-lasting, and less expensive. LEDs use less energy than other light sources to provide the necessary lighting desired for a street light. LED may last up to 100,000 hours, or up to 10 times longer than other lighting sources, which makes LEDs last the life of the pole and the entire light system in general, especially when said LEDs are housing and cooled by the apparatus of the preferred embodiments.

Multiple LED lights 150 are arranged around the entire, or at least a significant portion of the, circumference of the fixture 40. LED's are arranged in multiple vertical column units 155, and said column units 155 are spaced around the circumference of the fixture 40 to point LED light out from the fixture 360 degrees around the fixture. In alternative embodiments, LED's may be provided around only part of the circumference of the fixture, for example, only around 180 degrees of the fixture to shine light generally forward and to the sides, but not toward the back. Six of the LED column units 155 are provided, each with five LEDs, but more or fewer units and LEDs may be effective. Reflectors 154 are provided on some or all sides of each LED and may be positioned and slanted to reflect light outward and preferably slightly downward as needed for a particular environment. The preferred arrangement of LEDs results in their being, in effect, columns and rows of LEDs.

At the back of each LED column unit 155 are located cooling fins 160, protruding into the hollow interior space 162 of the housing 142 for exposure to air flowing upward from the middle section. Heat exchange from the fins and adjacent equipment to the flowing air cools each unit 155, to remove much of the heat produced from the LED's. This heat exchange is desired to keep the LED's in the range of about 20-80 degrees, F and, more preferably, in the range of 30-80 degrees F. LED performance and life are typically optimal when operated at approximately 30 degrees F., but a range of operation temperature (for example, 20-80 degrees F.) may be tolerated due to the inherent long lives of LEDs.

In the center of the fixture in FIG. 7, one may see an example control board 80, as discussed previously. Optionally, other equipment may be provided inside the fixture 40, extending through to or on the outside of the fixture 40, or in/on stem 166 or the rain cap C at the top of the fixture 40. Such equipment may include, for example, a camera and/or recorder for a security system, wireless network radio, antenna, motion sensor, and/or photocell. If provided on the outside, it is desirable to have such equipment consistent with the contour/shape of the fixture, for example, to be flush with, or to protrude only slightly from, the housing 142 outer surface. The control boards 80 and other equipment, if any, located inside the fixture 40 may be cooled by the upwardly-flowing air inside the fixture, in some embodiments, or, in other embodiments, may need to be insulated from their surroundings, depending on the heat balance in the LED fixture.

Figures 9, 10:
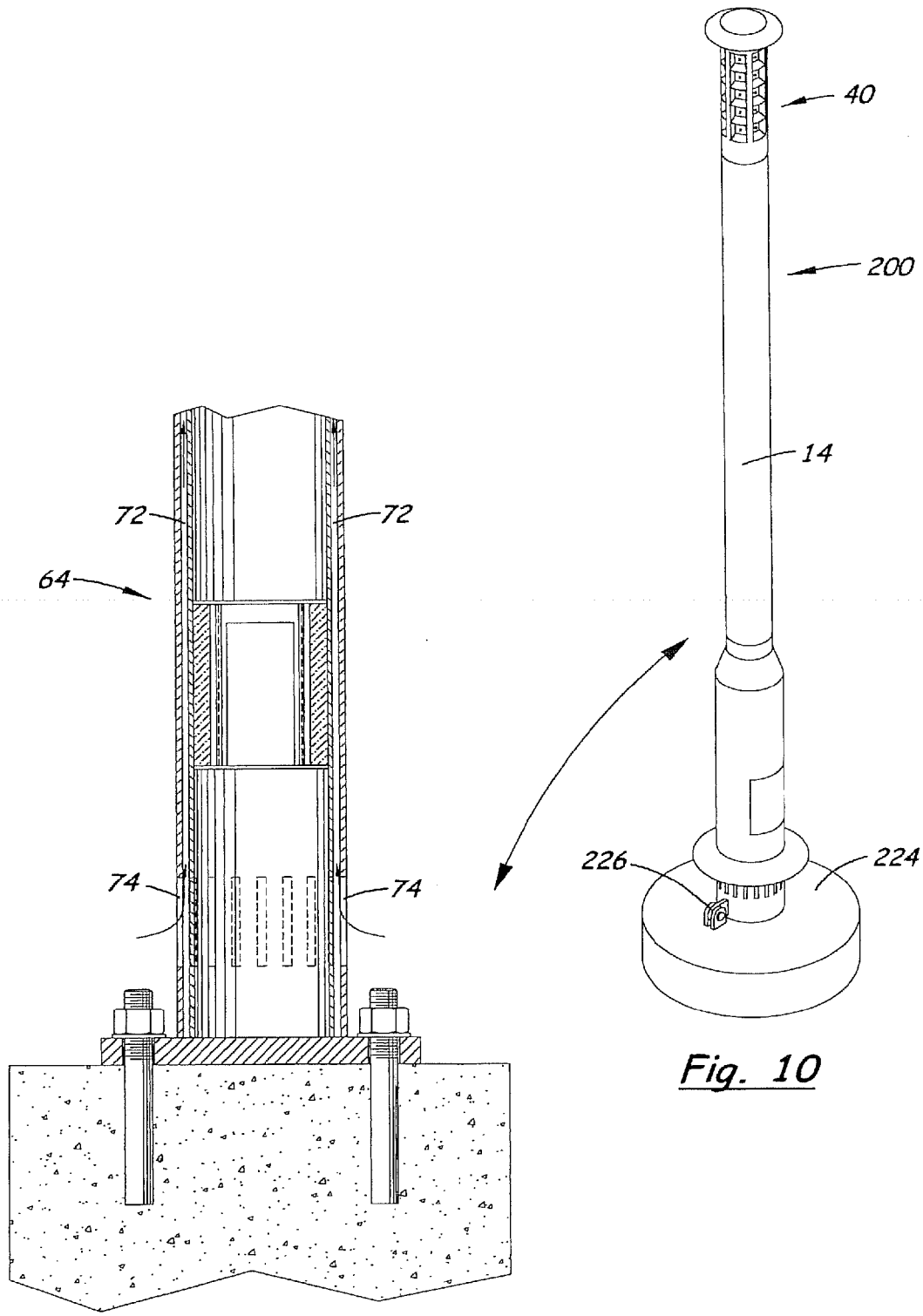
FIG. 9 is a partial, cross-sectional side view of the bottom section of the light pole containing a cooling sleeve and one or more batteries, illustrating natural air flow up through the sleeve. The rain skirt has been removed from this embodiment.
FIG. 10 is a side perspective view of an alternative embodiment of the invention, which comprises a portable light pole with LED fixture, said light pole being hinged to a portable base and so being pivotal from a generally horizontal position for transport or storage to a vertical position for use.

FIG. 9 portrays air being pulled into the lower section of the pole through slits 74 and continuing to flow up past the batteries and up through the pole, by natural convection. As provided by the structure of the pole and pole internals discussed above, the entire pole 12 will preferably be ventilated and designed to create an upward draft of air through the pole 12. This air flow cools the battery section and the LEDs, for improved operation and greater efficiency. The air flow may cool the circuit board and any other equipment that may be provided in LED fixture, depending on the heat balance in the fixture, or said circuit board and other equipment may need to be insulated to keep the LEDs from heating them beyond desirable temperatures. While other solar-powered outdoor lights have been proposed, none to the inventor's knowledge have a cooling feature, and the inventor believes that the preferred embodiments will exhibit increased efficiency and long-life, due to the special combination of LEDs and cooling for batteries and LEDs. Optionally, heating equipment may be provided in one or areas of the pole to protect equipment and/or enhance operation during extreme cold. Cable or film heating means may be effective, and may be controlled by a thermal sensor and controller.

FIG. 10 portrays an alternative embodiment of the invention, which is a portable, pivotal outdoor light 200. Light 200 comprises a pole with attached flexible panel 14 of amorphous thin-film photovoltaic material, LED fixture 40 at the top of the pole, and a heavy but portable base 224 that is neither connected to, nor buried in, the ground. The pole is hinged at 226 to the base 224, for tilt-up installation at the use site. A lock (not shown) may secure the pole in the upending position until it is desired to remove and move the portable light 200 to storage or another location. Batteries may be provided in the portable base 224.

FIG. 11 portrays an alternative embodiment 300 that includes a traffic light as well as a street light. The pole 12, panel 14, base 24, LED fixture 40, and decorative fixture 50 are the same or similar to those described above for the embodiment in FIGS. 1 and 2. An arm 302 extends from the middle section of the pole, to a position over a street intersection, for example. A traffic light 304 hangs from the arm 302, and is powered by the solar-powered system already described for the other embodiments. A control board and/or other apparatus and electronics will be provided to control the traffic light, in accordance with programs and instructions either programmed into the circuitry/memory of the embodiment 300 and/or received from a control network and/or central control station.

FIG. 12 portrays a break-away, road-side outdoor light 400 embodiment, which has its battery system 402 buried in a vault in the ground rather than being in the lower section of the pole. The electrical connection between the batteries and the panel, the batteries and the LED fixture extend underground. The rest of the light 400 is the same or similar as the embodiment in FIGS. 1 and 2, except that the lower section does not contain batteries, and the decorative light is a different one of many possible styles. The lower section of the pole may have a sleeve for encouraging draft and air flow up to the LED fixture, but does not need to contain brackets for batteries. An access door may be provided, for example, to check on or maintain wiring or connections that may be reachable from the lower section. Adaptations, such as break-away bolts, are provided to allow the pole to break-away when hit by a vehicle, as is required for many highway lights. Having the battery system buried in the ground enhances safety because vehicles will not crash into the full mass of the pole plus base plus battery system. Alternatively, batteries could be located in a buried base, to which the pole may be bolted. The pole may be steel or aluminum, and may have rust resistant coatings applied for extending underground.

FIGS. 13-16, as discussed above in the Summary of the Invention, illustrate the improved efficiency and effectiveness of the preferred embodiments of the invention. Sunlight hits the flexible amorphous panel 14 from all directions on its path "across the sky." The preferred continuous panel around at least 225 degrees of the pole circumference and along a substantial amount of the length of the pole, provides a large target that the sunlight hits "straight on" as much as is possible. The preferred cylindrical shape of the pole, and, hence, of the panel, provides a curved target that catches light from dawn to dusk.

The preferred outdoor light embodiments are what may be called "visually integrated," as they contain a great amount of operational capability inside and on a sleek, slim, and generally conventional-looking pole and installation. The preferred outdoor light embodiments do not include any flat-panel or framed solar cells. The pole has few if any protrusions, except for the optional rain shirt S which may be designed in many non-obtrusive ways, and an optional rain cap C that also may be designed in non-obtrusive ways. In embodiments having a decorative light fixture, said decorative light fixture may be considered a protrusion, but one that is expected and conventional-appearing. Most or all of the pole and its associated equipment, except for the decorative light, preferably varies only about 20 or less percent from the constant or substantially-constant diameter of the main (middle) section of the pole.

Particularly, the attachment of the preferred flexible amorphous light-active panel, or light-active materials of the future, is done simply and without racks, brackets, frames, and other complex or protruding material. Thus, the panel appears to simply be the side of the pole, for example, a painted or coated section of the pole wall. The preferred pole is a straight cylinder (with a constant diameter all along the middle section of the pole) that may be painted a dark color like black to match or blend with the dark color of the panel. The panel is not an ugly or strange-looking structure that would irritate the public, customers, or property owners who desire an aesthetically pleasing lighting system, and the panel does not have a high-tech appearance that might attract vandals or pranksters.

It should be noted that, while the preferred embodiments are outdoor lighting systems, that some embodiments of the invention may comprise the preferred LED fixture by itself and/or the preferred LED fixture in use with supports and equipment other than those shown herein. Also, some embodiments of the invention may comprise the preferred solar-powered pole by itself and/or connected to and powering equipment not comprising any light source, powering non-LED lights, and/or powering equipment other than is shown herein.

Although this invention has been described above with reference to particular means, materials and embodiments, it is to be understood that the invention is not limited to these disclosed particulars, but extends instead to all equivalents within the broad scope of the following claims.

The Invention claimed is:

1. A street light comprising:
   a pole having a cylindrical section with an outer surface having a circumference;
   a flexible panel of amorphous photovoltaic material connected to said outer surface so that the flexible panel curves at least 225 degrees around the cylindrical section;
   a light comprising a plurality of light-emitting-diodes (LEDs), wherein the light extends from an upper region of said pole;
   at least one battery operatively connected to said flexible panel so that, when sunlight hits said flexible panel, resulting electrical energy charges said at least one battery; and
   a controller operatively connected to said at least one battery and comprising electronics adapted to control charging of said at least one battery by the flexible panel, and also to control discharging of said at least one battery to light said LEDs, wherein said controller is adapted to control minimum battery voltage of said at least one battery by dimming said LEDs during at least a portion of nighttime to prevent excess battery drain.

2. A street light as in claim 1, wherein said controller is further adapted to control discharging of said at least one battery to power components selected from the group consisting of a camera, a security system recorder, a wireless network radio, an antenna, a motion sensor, and a photocell.

3. A street light as in claim 1, wherein said controller is further adapted to monitor voltage and temperature of said at least one battery.

4. A street light as in claim 1, wherein said flexible panel of amorphous photovoltaic material produces power from sunlight to charge said at least one battery from morning through evening, wherein power production is higher in the morning and evening, when sunlight hits the pole generally perpendicularly to said flexible panel, relative to lower power production at noon, when sunlight hits the flexible panel at an acute angle to said flexible panel.

5. A street light as in claim 1, wherein said controller limits maximum voltage to which said at least one battery is charged.

6. A street light as in claim 1, further comprising a motion sensor operatively connected to said controller to turn on the light and a timeclock operatively connected to said controller to turn off the light.

7. A street light as in claim 1, further comprising a photocell operatively connected to said controller to turn on the light and a timeclock operatively connected to said controller to turn off the light.

8. A street light as in claim 1, further comprising wireless communication between the street light and a central control station comprising control of performance of said street light, said wireless communication being selected from a group consisting of cell-phone, radio, and satellite communication.

9. A street light as in claim 1, further comprising wireless communication between the street light and a central control station comprising monitoring said street light, said communication being selected from a group consisting of cell-phone, radio, and satellite communication.

10. A street light as in claim 1, further comprising insulation on multiple sides of said at least one battery.

11. A street light as in claim 1, further comprising a connection to a utility power grid, and wherein said controller is adapted to provide, by means of an inverter, electricity produced by said flexible panel of amorphous photovoltaic material to said power grid during peak-electricity-usage daylight hours.

12. A street light as in claim 11, further comprising measurement systems adapted to measure and record energy contribution to the grid.

13. A street light as in claim 11, wherein said flexible panel of amorphous photovoltaic material produces power from sunlight to charge said at least one battery from morning through evening, wherein power production is higher in the morning and evening, when sunlight hits the pole generally perpendicularly to said flexible panel, relative to lower power production at noon, when sunlight hits the flexible panel at an acute angle to said flexible panel.

14. A street light as in claim 1, further comprising a connection to a utility power grid, and wherein said controller is adapted to provide electricity from said at least one battery to said power grid during peak-electricity-usage daylight hours.

15. A street light as in claim 14, further comprising measurement systems adapted to measure and record energy contribution to the grid.

16. A street light as in claim 14, wherein said flexible panel of amorphous photovoltaic material produces power from sunlight to charge said at least one battery from morning through evening, wherein power production is higher in the morning and evening, when sunlight hits the pole generally perpendicularly to said flexible panel, relative to lower power production at noon, when sunlight hits the flexible panel at an acute angle to said flexible panel.

17. A street light as in claim 1, further comprising wireless communication between said street light and other street lights.

18. A street light as in claim 17, further comprising wireless communication between said street light and a central control station comprising control of performance of said street light and said other street lights, said wireless communication being selected from a group consisting of cell-phone, radio, and satellite communication.

19. A street light as in claim 17, further comprising wireless communication between said street light and a central control station comprising monitoring said street light and said other street lights, said wireless communication being selected from a group consisting of cell-phone, radio, and satellite communication.

20. A method of operating a solar-powered street light, the method comprising:
providing a pole having a cylindrical region with an outer surface having a circumference;
connecting a flexible panel of photovoltaic material to said outer surface so that the flexible panel curves at least 225 degrees around the cylindrical section;
mounting a light on the pole; and
providing at least one battery operative connected to said flexible panel;
the method further comprising:
charging said at least one battery by said flexible panel producing electrical energy when sunlight hits said flexible panel; and
controlling said charging of said at least one battery by the flexible panel, and also controlling discharging of said at least one battery to light said light, said controlling of discharging comprises controlling minimum battery voltage by dimming said light during at least a portion of nighttime to prevent excess battery drain.

21. A method as in claim 20, wherein said controlling of discharging further comprises powering components selected from the group consisting of a camera, a security system recorder, a wireless network radio, an antenna, a motion sensor, and a photocell.

22. A method as in claim 20, further comprising monitoring voltage and temperature of said at least one battery.

23. A method as in claim 20, wherein said flexible panel of amorphous photovoltaic material produces power from sunlight, to charge said at least one battery, from morning through evening and wherein said flexible panel produces more power in the morning and evening, when sunlight hits the pole generally perpendicularly to said flexible panel, relative to lower power production at noon, when sunlight hits said flexible panel at an acute angle to said flexible panel.

24. A method as in claim 20, wherein said controlling of charging of said at least one battery by the flexible panel comprises limiting maximum voltage to which said at least battery is charged.

25. A method as in claim 20, further comprising turning on the light in response to a motion sensor and turning off the light by using a timeclock.

26. A method as in claim 20, further comprising wireless communication between said street light and a central control station comprising control of performance of said street light, said wireless communication being selected from the group consisting of cell-phone, radio, and satellite communication.

27. A method as in claim 20, further comprising wireless communication between the street light and a central control station comprising monitoring said street light, said communication being selected from a group consisting of cell-phone, radio, and satellite communication.

28. A method as in claim 20, further comprising providing insulation on multiple sides of said at least one battery.

29. A method as in claim 20, further comprising connecting said flexible panel to a utility power grid and providing electricity by means of an inverter to said power grid during daylight hours.

30. A method as in claim 29, further comprising measuring and recording energy contribution to the grid by said flexible panel.

31. A method as in claim 29, wherein said flexible panel of amorphous photovoltaic material produces power from sunlight, to charge said at least one battery, from morning through evening, and wherein said flexible panel produces more power in the morning and evening, when sunlight hits the pole generally perpendicularly to said flexible panel, relative to lower power production at noon, when sunlight hits the flexible panel at an acute angle to said flexible panel.

32. A method as in claim 2 0, further comprising providing a connection between said at least one battery and a utility power grid and providing electricity from said at least one battery to said power grid during peak-electricity-usage daylight hours.

33. A method as in claim 32, further comprising measuring and recording energy contribution to the grid by said at least one battery.

34. A method as in claim 32, wherein said flexible panel of amorphous photovoltaic material produces power from sunlight, to charge said at least one battery, from morning through evening, and wherein said flexible panel produces more power in the morning and evening, when sunlight hits the pole generally perpendicularly to said flexible panel, relative to lower power production at noon, when sunlight hits the flexible panel at an acute angle to said flexible panel.

35. A method as in claim 20, further comprising wireless communication between said street light and other street lights.

36. A method as in claim 35, further comprising wireless communication between said street light and a central control station comprising control of perfoimance of said street light and said other street lights, said wireless communication being selected from the group consisting of cell-phone, radio, and satellite communication.

37. A method as in claim 35, further comprising wireless communication between said street light and a central control station comprising monitoring said street light and said other street lights, said wireless communication being selected from a group consisting of cell-phone, radio, and satellite communication.

* * * * *